(12) United States Patent
Kato et al.

(10) Patent No.: US 8,933,541 B2
(45) Date of Patent: Jan. 13, 2015

(54) SEMICONDUCTOR DEVICE

(75) Inventors: Shinjiro Kato, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 689 days.

(21) Appl. No.: 12/459,372

(22) Filed: Jun. 30, 2009

(65) Prior Publication Data
US 2010/0001377 A1   Jan. 7, 2010

(30) Foreign Application Priority Data

Jul. 7, 2008   (JP) ................................. 2008-176958

(51) Int. Cl.
   *H01L 23/00*   (2006.01)
   *H01L 23/58*   (2006.01)
(52) U.S. Cl.
   CPC ....... *H01L 23/585* (2013.01); *H01L 2924/0002* (2013.01)
   USPC ................................... 257/622; 257/E23.002
(58) Field of Classification Search
   USPC ................... 257/510, 513, 622, 647, E23.002
   See application file for complete search history.

(56) References Cited

U.S. PATENT DOCUMENTS

| | | | | |
|---|---|---|---|---|
| 5,098,856 A | * | 3/1992 | Beyer et al. | 438/422 |
| 6,069,396 A | * | 5/2000 | Funaki | 257/492 |
| 6,300,223 B1 | * | 10/2001 | Chang et al. | 438/460 |
| 6,690,074 B1 | * | 2/2004 | Dierickx et al. | 257/398 |
| 2005/0224252 A1 | * | 10/2005 | Mishiro | 174/256 |
| 2008/0099874 A1 | * | 5/2008 | Kumano | 257/506 |
| 2008/0237726 A1 | * | 10/2008 | Dyer | 257/369 |

FOREIGN PATENT DOCUMENTS

JP   55123148 A   *   9/1980

OTHER PUBLICATIONS

Patent Abstracts of Japan, publication No. 2003-332270, publication date Nov. 21, 2003.

* cited by examiner

*Primary Examiner* — Yu Chen
(74) *Attorney, Agent, or Firm* — Adams & Wilks

(57) ABSTRACT

A semiconductor device has a semiconductor substrate with a semiconductor layer, a first element region formed on the semiconductor layer and on which are formed first semiconductor elements sensitive to stress, and a second element region formed on the semiconductor layer and on which are formed second semiconductor elements less sensitive to stress than the first semiconductor elements. The first and second element regions are formed in the semiconductor layer at preselected depths from a surface of the semiconductor layer. A buffer region for suppressing stress generated in the first element region is formed of a trench filled with a filler material and extending into the semiconductor layer so that a depth of the trench from the surface of the semiconductor layer is greater than the preselected depths, and so that a portion of the semiconductor layer exists under the filled trench of the buffer region.

18 Claims, 3 Drawing Sheets

SEMICONDUCTOR DEVICE

BACKGROUND OF THE INVENTION

1. Field of the Invention

The present invention relates to a semiconductor device capable of suppressing characteristic changes caused during a packaging process of the semiconductor device.

2. Description of the Related Art

Semiconductor devices formed on a wafer are cut and divided into chips through a dicing process to be assembled into packages. During a packaging process through sealing by resin and heat treatment, stress is applied to the semiconductor chip from the package, causing a warp in the semiconductor device whose characteristics are measured after the package assembling of the semiconductor device. Due to the warp, the measured characteristics of the semiconductor device may deviate from electrical characteristics of the semiconductor device measured on the wafer. As to a method for relaxing the stress, there has been proposed so far a method including forming a trench in a scribe region to thereby relax the stress in a wafer form, as disclosed in JP 2003-332270 A.

In such a method as described above, however, the effect for stress relaxation is obtained only in a wafer form, and it has been a problem that the stress relaxation cannot be expected in a chip form after the dicing process.

SUMMARY OF THE INVENTION

It is an object of the present invention to provide a semiconductor device which is capable of relaxing stress on a semiconductor chip caused during a packaging process, and which has small characteristic changes before and after the packaging process.

In order to solve the above-mentioned problems in the related art, the present invention employs the following means.

According to the present invention, there is provided a semiconductor device which includes: an element region which is prevented from receiving stress and which is formed on a semiconductor substrate; a buffer region provided around the element region which is prevented from receiving the stress; and a semiconductor element formation region which is provided around the buffer region.

In the semiconductor device, the element region which is prevented from receiving the stress is arranged substantially at a center of the semiconductor substrate.

The buffer region includes a trench and one of a filler embedded into the trench and a hollow surrounded by the trench. The trench has a depth larger than a depth of the element region which is prevented from receiving the stress, and larger than a depth of the semiconductor element formation region.

The filler in the buffer region of the semiconductor device includes a material having a Young's modulus lower than a Young's modulus of the semiconductor substrate.

A difference between the characteristics of the semiconductor device formed on a wafer and the characteristics of the semiconductor device assembled in a package is caused by the following reason. A resin used for sealing the semiconductor chip in the packaging process undergoes thermal expansion or thermal contraction during subsequent heat treatment, whereby tensile stress or compressive stress is applied to the semiconductor chip, adding additional resistance such as piezoresistance to elements. According to the present invention, the buffer region is formed around elements for which accuracy is particularly required for the circuit, whereby the buffer region absorbs the stress from the package, permitting suppression of the characteristic changes of the semiconductor device before and after the packaging process.

DETAILED DESCRIPTION OF THE INVENTION

Referring to the attached drawings, preferred modes for embodying the present invention are described below.

First Embodiment

Figure 1:
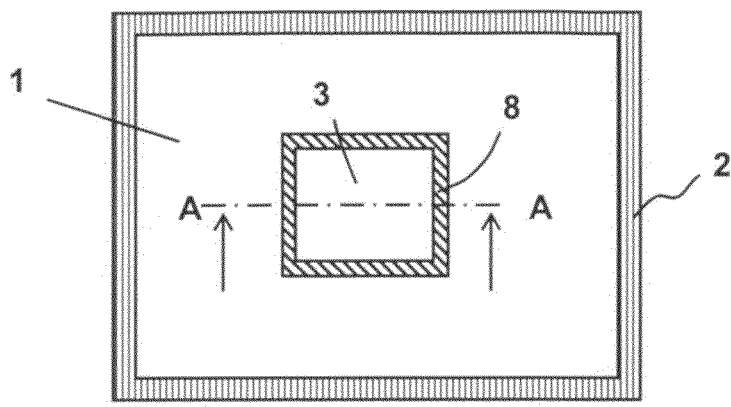
FIG. 1 is a plan view illustrating a semiconductor device according to a first embodiment of the present invention.

FIG. 1 is a plan view illustrating a semiconductor device 100 according to a first embodiment of the present invention. In FIG. 1, the semiconductor device 100 includes: a semiconductor element formation region 1 (second element region) to which stress induces little effect in terms of characteristics; a scribe region 2; an element region 3 (first element region) for which accuracy is particularly required and which is preferably prevented from receiving the stress during a packaging process; and a buffer region 8 for relaxing the stress (means for suppressing stress). For example, a current mirror circuit is a circuit in which currents flowing through two current paths act to be equal to each other by utilizing the fact that the same amount of current flows in each of the paired P-channel MOS transistors. Such paired transistors as described above are required to have characteristics little different from each other, and therefore are desirably formed within the above-mentioned element region 3 which is preferably prevented from receiving the stress.

According to the first embodiment of the present invention, arrangement is made into two divided regions so that elements which are prone to change their characteristics by stress are arranged within the element region 3 which is preferably prevented from receiving the stress, and elements which hardly change their characteristics by stress are arranged within the semiconductor element formation region 1. In addition, the element region 3 which is preferably prevented from receiving the stress is arranged at the center of a chip, the buffer region 8 is formed around the element region 3, and the semiconductor element formation region 1 is further provided around the buffer region 8. The reason for this arrangement is because, when the element region 3 which is preferably prevented from receiving the stress is arranged at the center of the chip, the influence of stress has a lesser effect on the element region 3 than a case where the element region 3 is arranged in a periphery of the semiconductor device 100.

Figure 2:
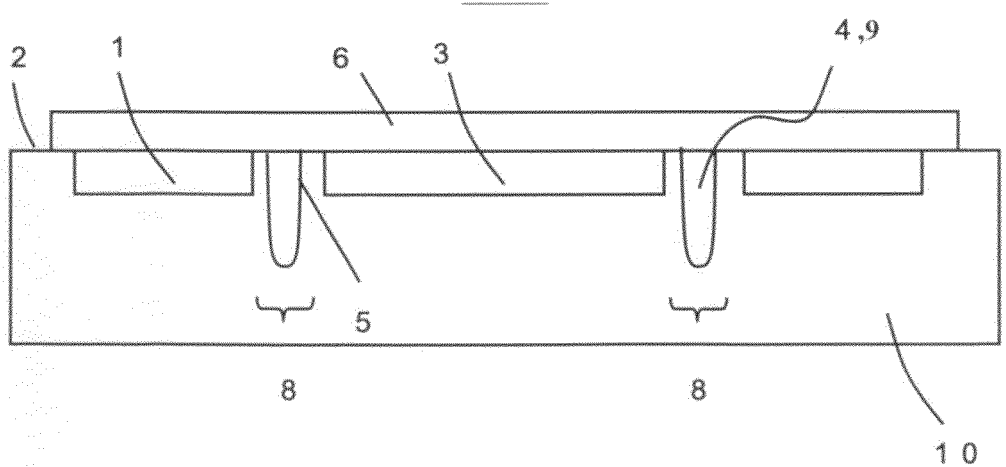
FIG. 2 is a cross-sectional view illustrating the semiconductor device taken along a line A-A of FIG. 1.

FIG. 2 is a cross-sectional view illustrating the semiconductor device 100 taken along a line A-A of FIG. 1. The element region 3 which is preferably prevented from receiving the stress and the semiconductor element formation region 1 are formed on a surface of a semiconductor substrate 10. The buffer region 8 is provided between the element region 3 and the semiconductor element formation region 1. The buffer region 8 includes a trench 5 which is dug from the surface of the semiconductor substrate 10 into an inside thereof, and a filler material (hereinafter "filler") 4 filling the trench 5 or a hollow 9 corresponding to a space inside the trench 5. The filler 4 having a low Young's modulus occupies the trench 5. A Young's modulus of silicon is approximately 110 GPa. The material to be embedded into the trench 5 is desired to have a Young's modulus lower than that of silicon. Thus, elastic materials such as polyimide, epoxy resin, rubber, and silicon resin are appropriate for the material. It should be noted that polyimide, epoxy resin, and rubber have Young's moduli of 3 to 5 GPa, 2.6 to 3 GPa, and 0.01 to 0.1 GPa, respectively.

In addition, a depth of the trench 5 is desirably larger than element formation depths of the semiconductor element formation region 1 and the element region 3 which is preferably prevented from receiving the stress. There may be employed a structure in which the trench 5 extends through the semiconductor substrate 10, and the element region 3 which is preferably prevented from receiving the stress and the surrounding semiconductor element formation region 1 are bonded to each other via the filler 4 embedded inside the trench 5. It should be noted that a film formed on an uppermost surface of the semiconductor device 100 is a protective film 6, and the protective film 6 is desirably made of an elastic material similarly to the case of the filler 4. Elements formed within the element region 3 which is preferably prevented from receiving the stress and elements formed within the surrounding semiconductor element formation region 1 are electrically connected to each other through an interconnection (not shown). The interconnection is arranged so as to lie across a surface of the filler 4 embedded inside the trench 5. In the case where the trench 5 is not embedded with the filler 4 but has a space as the hollow 9, those elements can also be electrically connected to each other by forming an interconnection on a rear surface of the protective film 6.

With the above-mentioned structure, stress to be applied to the semiconductor device from a sealing resin which is covered in the packaging process is absorbed through a distortion in the buffer region 8. As a result, the semiconductor device is suppressed from being warped due to the stress. Therefore, it becomes possible to suppress the characteristic changes in the elements arranged within the element region 3 which is preferably prevented from receiving the stress.

Second Embodiment

Figure 3:
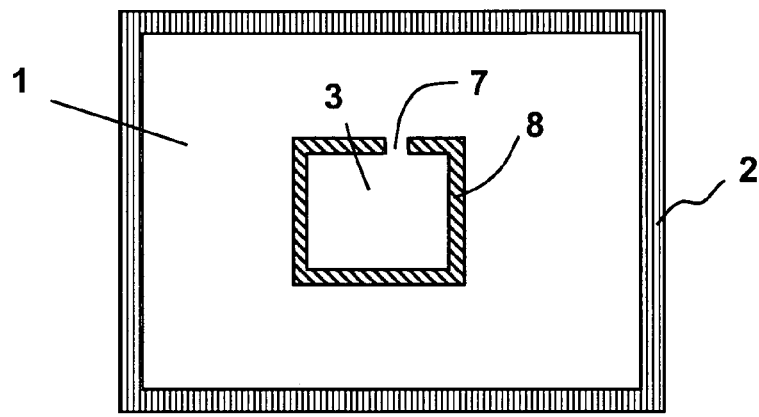
FIG. 3 is a plan view illustrating a semiconductor device according to a second embodiment of the present invention.

FIG. 3 is a plan view illustrating a semiconductor device 100 according to a second embodiment of the present invention. The semiconductor device 100 includes: a semiconductor element formation region 1 for elements which cause no problem even under stress; a scribe region 2; an element region 3 for elements for which accuracy is particularly required and which is preferably prevented from receiving the stress during a packaging process; a buffer region 8 for relaxing the stress; and a support region 7.

In the second embodiment, similarly to the first embodiment, the element region 3 which is preferably prevented from receiving the stress is also arranged at a center of the semiconductor device 100, and is also isolated from the surrounding semiconductor element formation region 1 by the buffer region 8. However, the support region 7 is provided for connecting the element region 3 which is preferably prevented from receiving the stress and the semiconductor element formation region 1 for elements which cause no problem even under the stress. The buffer region 8 is not provided in the support region 7. In the case where the element region 3 which is preferably prevented from receiving the stress is surrounded all around by the buffer region 8, an interconnection for electrically connecting the element region 3 which is preferably prevented from receiving the stress and the semiconductor element formation region 1 for elements which cause no problem even under the stress is formed so as to lie across the buffer region 8. In this state, when the semiconductor device 100 receives so large stress that the trench 5 expands or contracts largely, there is fear that the interconnection formed on the buffer region 8 cannot bear the expansion or contraction to be disconnected. However, in the second embodiment, the support region 7 is provided, and the interconnection for connecting both of the element region 3 and the semiconductor element formation region 1 lies on the support region 7. Therefore, the interconnection is not affected by the expansion or contraction caused by the stress. The structure of the second embodiment has higher reliability than that of the first embodiment. FIG. 3 illustrates an example in which only one support region 7 is provided, but a structure may be employed in which a plurality of the support regions 7 is provided.

Third Embodiment

Figure 4:
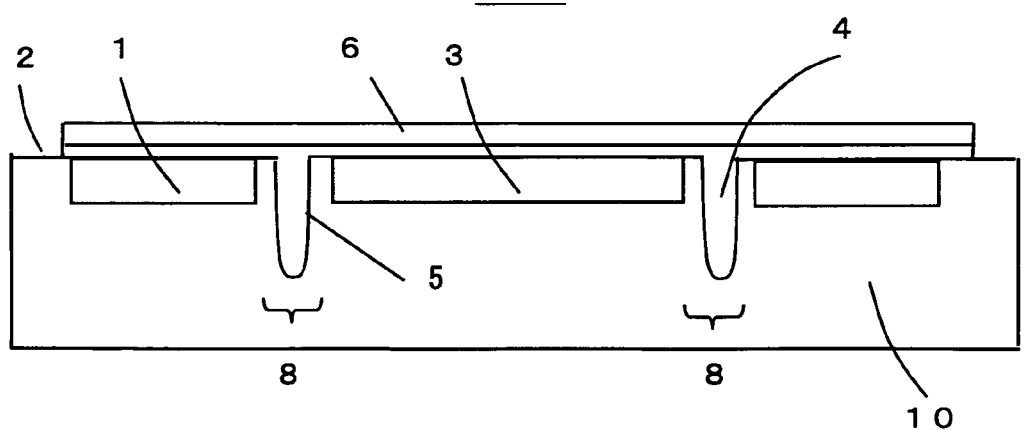
FIG. 4 is a cross-sectional view illustrating a semiconductor device according to a third embodiment of the present invention.

FIG. 4 is a cross-sectional view illustrating a semiconductor device 100 according to a third embodiment of the present invention. FIG. 4 is different from FIG. 2 in that the filler 4 is left on the surface of the semiconductor substrate 10. In this case, the semiconductor device 100 includes the support region 7, and an interconnection (not shown) is provided on the support region 7. As is apparent from this embodiment, the filler 4 may be embedded into the trench 5 at the formation of the protective film 6.

Fourth Embodiment

Figure 5:
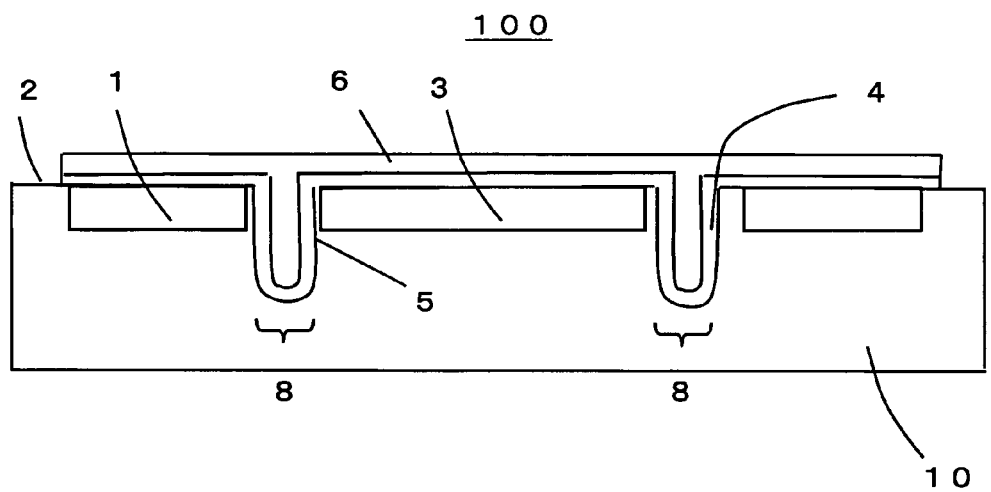
FIG. 5 is a cross-sectional view illustrating a semiconductor device according to a fourth embodiment of the present invention in a case where a width of a trench is set to be 10 to 30 µm.
Figure 6:
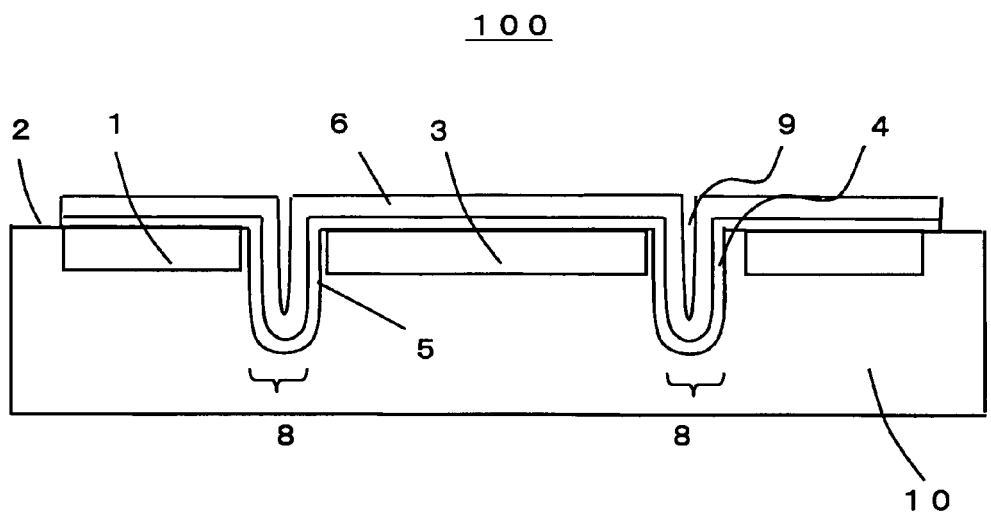
FIG. 6 is a cross-sectional view illustrating the semiconductor device according to the fourth embodiment of the present invention in a case where the width of the trench is set to be 30 to 100 µm.

FIG. 5 is a cross-sectional view illustrating a semiconductor device 100 according to a fourth embodiment of the present invention. In a case where a width of the trench 5 is set to be approximately 10 to 30 μm, the trench 5 does not need to be completely filled with the filler 4. The remaining space in the trench 5 may be filled with the protective film 6. Alternatively, in a case where the width of the trench 5 is set to be 30 to 100 μm, such a structure as illustrated in FIG. 6 may be employed in which an inner wall surface of the trench 5 is protected by the filler 4 and the protective film 6, and the hollow 9 having a cylindrical shape is provided inside the resultant trench 5.

What is claimed is:
1. A semiconductor device, comprising:
a semiconductor substrate comprised of a semiconductor layer;
an element region that is prevented from receiving stresses applied to the semiconductor device and on which semiconductor elements sensitive to stress are formed, the element region comprising a current mirror circuit and being formed in the semiconductor layer at a preselected depth from a surface thereof and arranged substantially at a center of the semiconductor layer;

a buffer region formed around the element region for absorbing stresses applied to the semiconductor device to prevent the element region from receiving the stresses, the buffer region comprising a trench formed in the semiconductor layer and a filler material filled in the trench and having a Young's modulus lower than a Young's modulus of the semiconductor layer; and a semiconductor element formation region on which semiconductor elements not sensitive to stress are formed, the semiconductor element formation region being formed in the semiconductor layer at a preselected depth from the surface thereof, the semiconductor element formation region extending around the buffer region with the buffer region disposed between the semiconductor element formation region and the element region, and the trench of the buffer region extending into the semiconductor layer so that a depth of the trench from the surface of the semiconductor layer is greater than the preselected depth of each of the element region and the semiconductor element formation region and so that a portion of the semiconductor layer exists under the filled trench of the buffer region.

2. A semiconductor device, comprising:

a semiconductor substrate comprised of a semiconductor layer;

an element region comprising a current mirror circuit and formed in the semiconductor layer on a portion of the semiconductor substrate that is prevented from receiving stresses applied to the semiconductor device and on which semiconductor elements sensitive to stress are formed;

a buffer region formed around the element region for absorbing stresses applied to the semiconductor device to prevent the element region from receiving the stresses, the buffer region comprising a trench formed in the semiconductor layer and a filler material at least partially filling the trench, the trench extending into the semiconductor layer at a depth from a surface of the semiconductor layer so that a portion of the semiconductor layer exists under the at least partially filled trench; and a semiconductor element formation region on which semiconductor elements not sensitive to stress are formed, the semiconductor element formation region being formed in the semiconductor layer so as to extend around the buffer region with the buffer region disposed between the semiconductor element formation region and the element region.

3. A semiconductor device according to claim 2; wherein the element region is arranged substantially at a center of the semiconductor substrate.

4. A semiconductor device according to claim 2; wherein the buffer region entirely surrounds the element region.

5. A semiconductor device according to claim 2; further comprising at least one support region provided between the buffer region and the element region.

6. A semiconductor device according to claim 5; wherein the at least one support region comprises a plurality of the support regions.

7. A semiconductor device according to claim 2; wherein the trench has a hollow formed therein.

8. A semiconductor device according to claim 2; wherein the depth of the trench is larger than a depth of each of the element region and the semiconductor element formation region formed in the semiconductor layer.

9. A semiconductor device according to claim 2; wherein the filler material has a Young's modulus lower than a Young's modulus of the semiconductor substrate.

10. A semiconductor device according to claim 2; wherein the filler material comprises a material selected from any one of polyimide, epoxy resin, rubber, and silicon resin.

11. A semiconductor device according to claim 2; wherein the filler material completely fills the trench.

12. A semiconductor device according to claim 11; wherein the filler material extends out of the trench and covers surfaces of the element region and semiconductor element region.

13. A semiconductor device according to claim 2; wherein the filler material fills only a portion of the trench; and further comprising a protective film filling a remaining portion of the trench that is not filled by the filler material.

14. A semiconductor device according to claim 2; wherein the filler material covers an inner wall surface of the trench so as to fill only a portion of the trench; and further comprising a protective film disposed on the filler material and filling a remaining portion of the trench that is not filled by the filler material except for a portion of the trench that remains hollow without being filled by the filler material or the protective film.

15. A semiconductor device according to claim 14; wherein the filler material extends out of the trench and covers surfaces of the element region and semiconductor element region.

16. A semiconductor device comprising:

a semiconductor substrate comprising a semiconductor layer;

a first element region comprising a current mirror circuit formed in the semiconductor layer and on which are formed semiconductor elements sensitive to stress;

a second element region formed in the semiconductor layer and on which are formed semiconductor elements less sensitive to stress than the semiconductor elements on the first element region; and a buffer region formed on the semiconductor substrate for substantially suppressing stress generated in the first element region, the buffer region the buffer region comprising a trench formed in the semiconductor layer and a filler material at least partially filling the trench, the trench extending into the semiconductor layer at a depth from a surface of the semiconductor layer so that a portion of the semiconductor layer exists under the at least partially filled trench.

17. A semiconductor device according to claim 16; wherein the filler material completely fills and extends out of the trench so as to cover surfaces of the first and second element regions.

18. A semiconductor device according to claim 16; wherein the filler material covers an inner wall surface of the trench so as to fill only a portion of the trench; and further comprising a protective film disposed on the filler material and filling a remaining portion of the trench that is not filled by the filler material except for a portion of the trench that remains hollow without being filled by the filler material or the protective film.

* * * * *